(12) United States Patent
Park et al.

(10) Patent No.: US 10,270,014 B2
(45) Date of Patent: Apr. 23, 2019

(54) LIGHT-EMITTING DEVICE PACKAGE

(71) Applicant: SAMSUNG ELECTRONICS CO., LTD., Suwon-si, Gyeonggi-do (KR)

(72) Inventors: Woo Jung Park, Hwaseong-si (KR); JungSung Kim, Seoul (KR); JungKyu Park, Seoul (KR); Taeyoung Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 11 days.

(21) Appl. No.: 15/728,579

(22) Filed: Oct. 10, 2017

(65) Prior Publication Data

US 2018/0138375 A1    May 17, 2018

(30) Foreign Application Priority Data

Nov. 11, 2016 (KR) .................. 10-2016-0150559

(51) Int. Cl.
*H01L 23/495* (2006.01)
*H01L 33/26* (2010.01)
*H01L 33/62* (2010.01)
*H01L 33/60* (2010.01)
*H01L 33/48* (2010.01)
(Continued)

(52) U.S. Cl.
CPC .......... *H01L 33/504* (2013.01); *H01L 33/483* (2013.01); *H01L 33/508* (2013.01); *H01L 33/54* (2013.01); *H01L 33/60* (2013.01); *H01L 33/44* (2013.01); *H01L 33/486* (2013.01); *H01L 33/505* (2013.01); *H01L 33/507* (2013.01); *H01L 33/62* (2013.01); *H01L 2224/16245* (2013.01)

(58) Field of Classification Search
CPC ................... H01L 33/507; H01L 33/58; H01L 2924/0002; H01L 2924/00; H01L 33/46; H01L 33/50
See application file for complete search history.

(56) References Cited

U.S. PATENT DOCUMENTS 6,953,952 B2    10/2005   Asakawa
7,242,031 B2     7/2007   Sakai
(Continued)

FOREIGN PATENT DOCUMENTS

JP    2000-150965 A    5/2000
JP    2003-046136 A    2/2003
(Continued)

*Primary Examiner* — Brian Turner
(74) *Attorney, Agent, or Firm* — Lee & Morse, P.C.

(57) ABSTRACT

A light-emitting device (LED) package including a package body including a mounting region at an upper portion thereof; a lead frame below the package body; a semiconductor light-emitting device in the mounting region and electrically connected to the lead frame; a top layer attached to a top surface of the semiconductor light-emitting device, the top layer including a red phosphor; and a molding layer in the mounting region, the molding layer covering the top layer and including a short-wavelength phosphor having a peak emission wavelength that is shorter than a peak emission wavelength of the red phosphor, wherein the top layer exposes a side surface of the semiconductor light-emitting device, and the molding layer is in contact with the side surface of the semiconductor light-emitting device.

16 Claims, 9 Drawing Sheets

(51) Int. Cl.
  *H01L 33/54* (2010.01)
  *H01L 33/50* (2010.01)
  *H01L 33/44* (2010.01)

(56) References Cited

U.S. PATENT DOCUMENTS

| | | | |
|---|---|---|---|
| 8,098,005 | B2 | 1/2012 | Kwak et al. |
| 8,253,326 | B2 | 8/2012 | Maruyama et al. |
| 8,598,604 | B2 | 12/2013 | Eisert et al. |
| 8,729,788 | B2 | 5/2014 | Masuda et al. |
| 8,921,878 | B2 | 12/2014 | Mitsuishi et al. |
| 9,054,280 | B2 | 6/2015 | Maeno et al. |
| 2007/0030703 | A1* | 2/2007 | Lee ............... H01L 33/647 313/483 |
| 2008/0265268 | A1 | 10/2008 | Braune et al. |
| 2009/0039762 | A1 | 2/2009 | Park et al. |
| 2009/0236622 | A1 | 9/2009 | Nishihara |
| 2012/0182714 | A1 | 7/2012 | Kwon et al. |
| 2012/0187432 | A1* | 7/2012 | Kawaguchi ....... H01L 33/486 257/98 |
| 2012/0230010 | A1 | 9/2012 | Kato et al. |
| 2012/0306356 | A1 | 12/2012 | Yoon et al. |
| 2013/0062639 | A1* | 3/2013 | Doan ................ H01L 33/50 257/98 |
| 2014/0145205 | A1* | 5/2014 | Kong ............... H01L 33/486 257/76 |
| 2014/0145229 | A1* | 5/2014 | Park ................ H01L 33/508 257/98 |
| 2014/0367633 | A1* | 12/2014 | Bibl ............. G02F 1/133603 257/13 |
| 2015/0060921 | A1* | 3/2015 | Okahisa ............ H01L 33/60 257/98 |
| 2015/0188001 | A1 | 7/2015 | Schricker et al. |
| 2016/0017221 | A1* | 1/2016 | Okura .............. C09K 11/7734 257/98 |

FOREIGN PATENT DOCUMENTS

| | | |
|---|---|---|
| JP | 2008-159707 A | 7/2008 |
| JP | 2009-506557 A | 2/2009 |
| JP | 2010-100743 A | 5/2010 |
| JP | 2014-082416 A | 5/2014 |
| JP | 5707697 B2 | 4/2015 |
| JP | 2015-130459 A | 7/2015 |
| JP | 5875816 B2 | 3/2016 |
| KR | 10-1077990 B1 | 10/2011 |

* cited by examiner

LIGHT-EMITTING DEVICE PACKAGE

CROSS-REFERENCE TO RELATED APPLICATION

Korean Patent Application No. 10-2016-0150559, filed on Nov. 11, 2016, in the Korean Intellectual Property Office, and entitled: "Light-Emitting Device Package," is incorporated by reference herein in its entirety.

BACKGROUND

1. Field

Embodiments relate to a light-emitting device package.

2. Description of the Related Art

A semiconductor light-emitting device such as a light-emitting diode (LED) may include a semiconductor layer that is configured to emit light using recombination of electrons and holes. The LED devices may be used for various applications (e.g., illumination, display devices, and light sources) and are being developed more and more.

SUMMARY

The embodiments may be realized by providing a light-emitting device (LED) package including a package body including a mounting region at an upper portion thereof; a lead frame below the package body; a semiconductor light-emitting device in the mounting region and electrically connected to the lead frame; a top layer attached to a top surface of the semiconductor light-emitting device, the top layer including a red phosphor; and a molding layer in the mounting region, the molding layer covering the top layer and including a short-wavelength phosphor having a peak emission wavelength that is shorter than a peak emission wavelength of the red phosphor, wherein the top layer exposes a side surface of the semiconductor light-emitting device, and the molding layer is in contact with the side surface of the semiconductor light-emitting device.

The embodiments may be realized by providing a light-emitting device (LED) package including a package body including a mounting region at an upper portion thereof; a lead frame below the package body; a semiconductor light-emitting device in the mounting region and electrically connected to the lead frame; a top layer attached to a top surface of the semiconductor light-emitting device, the top layer including a red phosphor; and a molding layer in the mounting region, the molding layer covering the top layer and including a short-wavelength phosphor having a peak wavelength that is shorter than a peak wavelength of the red phosphor, wherein the mounting region includes a reflection region that extends from a top surface of the package body to a center portion of the package body, and an extension region that extends from the reflection region to a side surface of the semiconductor light-emitting device, and wherein the top layer is spaced apart from the extension region.

The embodiments may be realized by providing a light-emitting device (LED) package including a package body including a mounting region at one side thereof; a lead frame on a side of the package body that is opposite to the mounting region; a semiconductor light-emitting device in the mounting region and electrically connected to the lead frame; a top layer on a top surface of the semiconductor light-emitting device, the top layer including a red phosphor; and a molding layer in the mounting region and covering the top layer, the molding layer including a short-wavelength phosphor that has a peak wavelength that is shorter than that of the red phosphor, wherein the molding layer is in contact with the side surface of the semiconductor light-emitting device.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
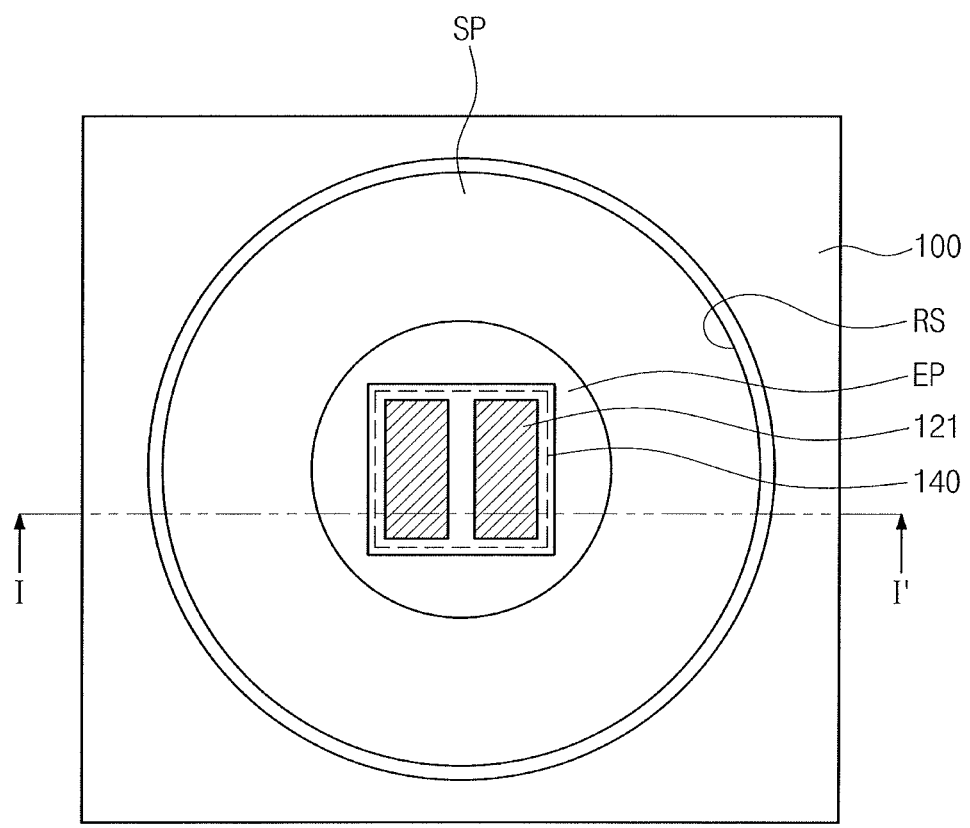
FIG. 1 illustrates a plan view of a light-emitting device package, according to some embodiments.
Figure 2:
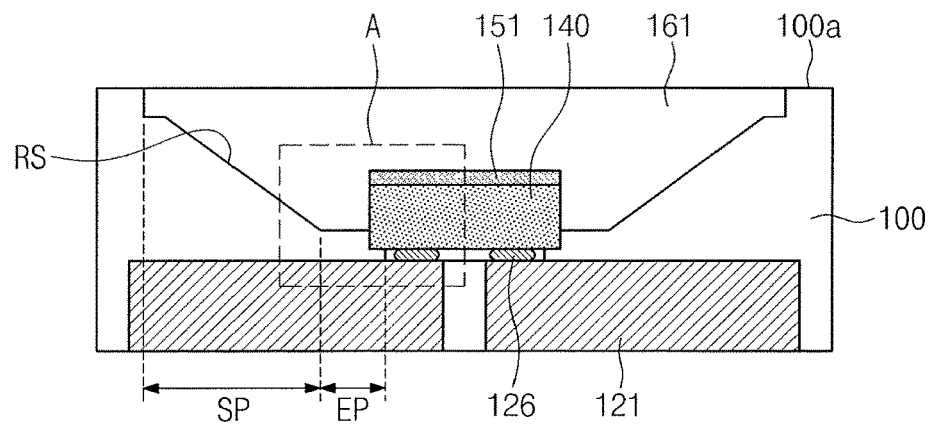
FIG. 2 illustrates a sectional view taken along line I-I' of FIG. 1.
Figure 3:
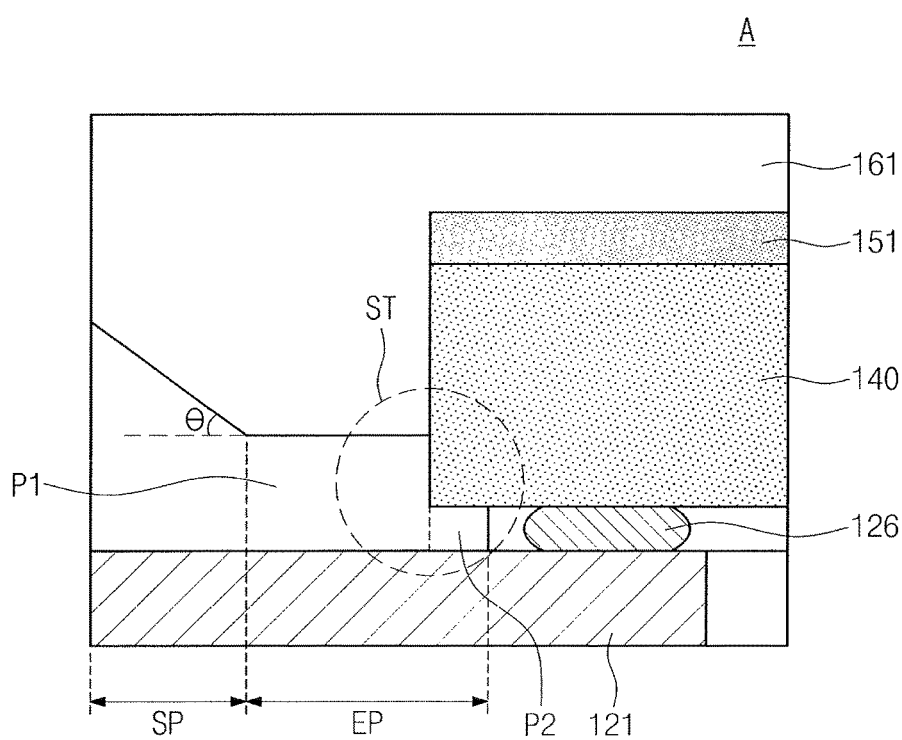
FIG. 3 illustrates an enlarged view of a portion A of FIG. 2.
Figure 4:
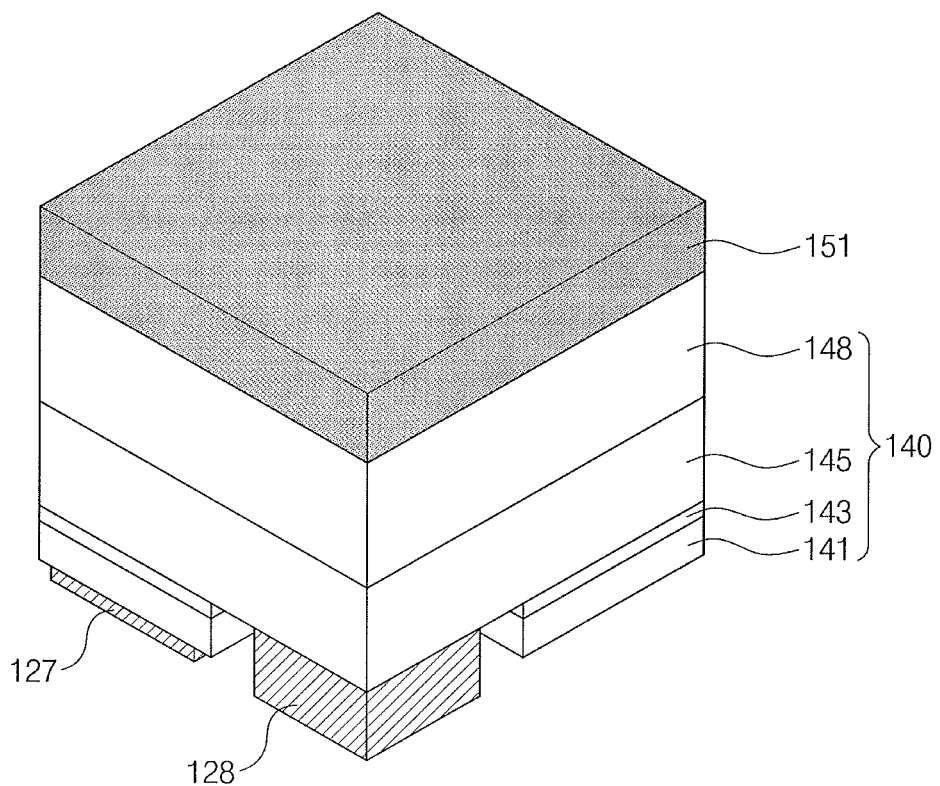
FIG. 4 illustrates a perspective view of an example of a semiconductor light-emitting device.

FIG. 1 illustrates a plan view of a light-emitting device package, according to some embodiments. FIG. 2 illustrates a sectional view taken along line I-I' of FIG. 1. FIG. 3 illustrates an enlarged view of a portion A of FIG. 2. FIG. 4 illustrates a perspective view of an example of a semiconductor light-emitting device.

Referring to FIGS. 1 to 4, a light-emitting device package may include a package body 100, a lead frame 121 provided in the package body 100, and a semiconductor light-emitting device 140 connected to the lead frame 121.

The package body 100 may include a mounting region RS provided at an upper portion thereof (e.g., at an outward facing region thereof in a direction of light emission). The mounting region RS may be a recessed structure, which is defined by a top (e.g., outer) surface 100a of the package body 100. A bottom of the mounting region RS may partially expose a top (e.g., outer) surface of the lead frame 121. The mounting region RS may extend from the top surface 100a of the package body 100 to a side surface of the semiconductor light-emitting device 140. For example, the mounting region RS may include a reflection region SP, which may be connected, continuous, or adjacent to the top surface 100a of the package body 100. For example, the mounting region RS may include an extension region EP, which may extend from the reflection region SP to the side surface of the semiconductor light-emitting device 140.

The reflection region SP may have an inclined surface, which may reflect light generated in the semiconductor light-emitting device 140 toward a top (e.g., outer) surface of the semiconductor light-emitting device package. The inclined surface of the reflection region SP may be inclined at an inclination angle θ relative to the top surface 100a (or a bottom surface) of the package body 100. The inclination angle θ may be determined or selected in consideration of a width of the semiconductor light-emitting device 140 and a width of the mounting region RS. In an implementation, the semiconductor light-emitting device package may have the highest light flux when the inclination angle θ is about 20° to 40°.

The extension region EP may cover (e.g., at least a part of) the top surface of the lead frame 121, e.g., the part of the top surface of the lead frame 121 that is between the reflection region SP and the semiconductor light-emitting device 140. The extension region EP may have a stepwise or stepped structure ST. For example, the extension region EP may include a first portion P1 that is connected or adjacent to the reflection region SP, and a second portion P2 that extends from the first portion P1 and is interposed between the semiconductor light-emitting device 140 and the lead frame 121. The first portion P1 may be thicker than the second portion P2 (e.g., in a direction extending away from the lead frame 121). In an implementation, the first portion P1 may have a circular or ring shape or may have a different shape, depending on a shape of the mounting region RS. A planar shape of the second portion P2 may be determined in consideration of the shape of the semiconductor light-emitting device 140. In an implementation, the planar shape of the second portion P2 may be a square ring shape extending along a circumference or perimeter of an outside edge of the semiconductor light-emitting device 140. A top surface of the first portion P1 may be substantially parallel with a top surface of the lead frame 121. In an implementation, the first portion P1 may not be substantially parallel to the lead frame 121 and may be inclined at an angle that is smaller than the inclination angle θ, relative to the top surface of the lead frame 121.

The semiconductor light-emitting device 140 may be mounted on a region that is defined by the stepwise structure ST of the first and second portions P1 and P2. For example, the semiconductor light-emitting device 140 may be inserted into a region that is defined by a side surface of the first portion P1 and a top surface of the second portion P2. The semiconductor light-emitting device 140 may be provided in such a way that its bottom (e.g., inward facing) surface, e.g., a circumferential portion of the bottom surface, is in contact with the top surface of the second portion P2. In an implementation, the side surface of the first portion P1 may contact the side surface of the semiconductor light-emitting device 140 or at least a portion of the side surface of the first portion P1 may be spaced apart from the side surface of the semiconductor light-emitting device 140. The extension region EP may cover the top surface of the lead frame 121 between the semiconductor light-emitting device 140 and the reflection region SP, and it is possible to help prevent the light flux from being lowered by the lead frame 121. In addition, the extension region EP may define a region on which the semiconductor light-emitting device 140 is mounted, and it is possible to dispose the semiconductor light-emitting device 140 on the lead frame 121 in a more regular or uniform manner.

The lead frame 121 may be located below the package body 100 (e.g., relative to a light emission direction). The top surface of the lead frame 121 may be partially exposed by the mounting region RS of the package body 100, and solder bumps 126 may be provided on the exposed top surface of the lead frame 121. The solder bumps 126 may provide electrical connection paths to the semiconductor light-emitting device 140. The shape of the lead frame 121 may be variously changed depending on a kind or shape of the light-emitting device package. The lead frame 121 may be formed of or include, e.g., copper, aluminum, iron, or combinations thereof.

The semiconductor light-emitting device 140 may be provided on the portion of the lead frame 121 exposed by the mounting region RS. In an implementation, the semiconductor light-emitting device 140 may be electrically connected to the lead frame 121 through the solder bumps 126. For example, the semiconductor light-emitting device 140 may be mounted on the lead frame 121 in a flip-chip manner. The semiconductor light-emitting device 140 will be described in more detail below with reference to FIG. 4.

Referring to FIG. 4, the semiconductor light-emitting device 140 according to an embodiment may include a first semiconductor layer 141 of a first conductivity type, a second semiconductor layer 145 of a second conductivity type, and an active layer 143 therebetween. In an implementation, the semiconductor light-emitting device 140 may emit a blue light, and the light-emitting device package may emit white light by using red phosphors and green phosphors as described below. The first semiconductor layer 141 may be a GaN layer doped with p-type dopants (e.g., Zn, Cd, Be, Mg, Ca, or Ba). The second semiconductor layer 145 may be a GaN layer doped with n-type dopants (e.g., Si). The active layer 143 may include a material having a multi quantum well (MQW) structure (e.g., in which quantum well layers and quantum barrier layers are alternately stacked one on another). For example, the active layer 143 may include GaN and InGaN layers, which are alternately stacked one on another.

A support substrate 148 may be provided on the second semiconductor layer 145. The support substrate 148 may be formed of or include, e.g., sapphire, SiC, Si, $MgAl_2O_4$, MgO, $LiAlO_2$, $LiGaO_2$, or GaN. In the case where the support substrate 148 is formed of a heterogeneous material such as sapphire, a buffer layer may be provided between the support substrate 148 and the second semiconductor layer 145 to help reduce the possibility of technical issues resulting from a difference in lattice constant between the support substrate 148 and the second semiconductor layer 145. In an implementation, the buffer layer may be, e.g., a low-temperature GaN layer.

A first electrode 127 may be provided on a bottom surface of the first semiconductor layer 141 (e.g., a lead frame-facing surface of the semiconductor light-emitting device). The first semiconductor layer 141 and the active layer 143 may be partially etched by an etching process, and as a result, a portion of a bottom surface of the second semiconductor layer 145 may be exposed. A second electrode 128 may be provided on the exposed bottom surface of the second semiconductor layer 145. In an implementation, an ohmic contact layer may be provided between the first electrode 127 and the first semiconductor layer 141 and between the second electrode 128 and the second semiconductor layer 145. The first and second electrodes 127 and 128 may reflect light generated in the active layer 143. In an implementation, an additional reflection layer may be provided between the first electrode 127 and the first semiconductor layer 141. The additional reflection layer may be formed of or include, e.g., Ag, Al, or Pt.

Referring back to FIGS. 1 to 3, a top layer 151 may be provided on the top surface of the semiconductor light-emitting device 140. The top layer 151 may include a red phosphor. In an implementation, a peak or central emission wavelength of the red phosphor may be 580 nm to 660 nm.

In an implementation, the red phosphor may include, e.g., an α-SiAlON phosphor, a CASN (CaAlSiN$_3$:Eu$^{2+}$) phosphor, a SCASN ((Sr, Ca)AlSiN$_3$:Eu$^{2+}$ phosphor, a (Ca, Sr, Ba, Mg)$_2$Si$_5$N$_8$:Eu$^{2+}$ phosphor, a KSF (K$_2$SiF$_6$:Mn$^{4+}$) phosphor, a (Ca, Mg, Sr)Al$_{12}$O$_{19}$:Mn$^{2+}$ phosphor, or a Sr$_x$Mg$_y$Si$_z$N$_{2(x+y+2z)/3}$:Eu$_w$ phosphor (in which 0.5≤x<2, 2.5≤y≤3.5, 1≤z≤2, and 0<w≤0.2). The red phosphor may be provided in an amount of, e.g., about 0.1 wt % to about 90 wt %, based on a total weight of phosphors in the light-emitting device package. The top layer 151 may include, e.g., SiO$_2$, TiO$_2$, or Si particles, which are used as an inorganic dispersing agent. In an implementation, the SiO$_2$, TiO$_2$, or Si particles may be included in the top layer 151 in an amount of 0 wt % to 300 wt %, based on a weight of molding silicon in the top layer 151.

The red phosphor may be provided in a silicone polymer or in a ceramic material such as glass. In an implementation, the top layer 151 may be formed in a film structure or plate structure, and then may be divided into a plurality of chip-sized pieces, and each of the pieces of the top layer 151 may be attached to the top surface of the semiconductor light-emitting device 140. In an implementation, the top layer 151 may be attached to the top surface of the semiconductor light-emitting device 140 using, e.g., an adhesive silicone or epoxy layer. The attachment of the top layer 151 may be performed after the semiconductor light-emitting device 140 is provided in the mounting region RS.

The top layer 151 may have a shape corresponding to (e.g., the same as) that of the top surface of the semiconductor light-emitting device 140. The top layer 151 may expose the side surface of the semiconductor light-emitting device 140. For example, the top layer 151 may not extend onto the side surface of the semiconductor light-emitting device 140. The lowermost surface of the top layer 151 (e.g., the lead frame-facing surface) may be located at a level that is equal to or higher than the uppermost surface of the semiconductor light-emitting device 140 (e.g., based on a distance from the lead frame 121). Depending on a process condition, a portion of the top layer 151 may partially cover an upper side surface of the support substrate 148, but even in this case, the top layer 151 may not cover the side surfaces of the first and second semiconductor layers 141 and 145 and the side surface of the active layer 143. The side surface of the semiconductor light-emitting device 140 may be covered with a molding layer to be described below.

A thickness of the top layer 151 (e.g., in a direction extending away from the lead frame 121) may be, e.g., about 5% to 20% of a total thickness of the semiconductor light-emitting device 140. In an implementation, the thickness of the top layer 151 may be, e.g., about 30 µm to about 400 µm.

An area of the top layer 151 may be controlled or selected in consideration of an area of the top surface of the semiconductor light-emitting device 140 thereunder. In an implementation, the area of the top layer 151 may be decreased (e.g., may be relatively smaller) to help improve an adhesion property between the top layer 151 and the semiconductor light-emitting device 140 and/or a light flux property of the light-emitting device package. In an implementation, the area of the top layer 151 may be increased (e.g., may be relatively larger) to facilitate formation of the top layer 151 and to help improve reliability of the light-emitting device package. In an implementation, by controlling the area of the top layer 151, it is possible to obtain a desired color temperature and to increase a light flux. In order to realize a light-emitting device package with high light flux and low color temperature (e.g., warm white) properties, the area of the top layer 151 may be increased. In order to realize a light-emitting device package with high light flux and high color temperature (e.g., cool white) properties, the area of the top layer 151 may be decreased. The area of the top layer 151 may be, e.g., about 70% to 200% of an area of the top surface of the semiconductor light-emitting device 140. In an implementation, if, at a color temperature of 1,500 K, a light-emitting device package of 3,000 K is desired, the area of the top layer 151 may be about 100% to 200% (e.g., from 110% to 150%) of that of the top surface of the semiconductor light-emitting device 140. In an implementation, if, at a color temperature of 3,000 K, a light-emitting device package of 6,000 K is desired, the area of the top layer 151 may be about 70% to 100% (e.g., from 80% to 100%) of that of the top surface of the semiconductor light-emitting device 140. In an implementation, the side surface of the top layer 151 may be aligned with that of the semiconductor light-emitting device 140 or the side surface of the top layer 151 may be spaced apart from (e.g., may extend beyond) the side surface of the semiconductor light-emitting device 140 by a distance of about 800 µm or less, in consideration of a process margin in the attaching process. In an implementation, the side surface of the top layer 151 may have a shape protruding horizontally from (e.g., beyond) the side surface of the semiconductor light-emitting device 140 or may expose a portion of the top surface of the semiconductor light-emitting device 140.

Figure 5A:
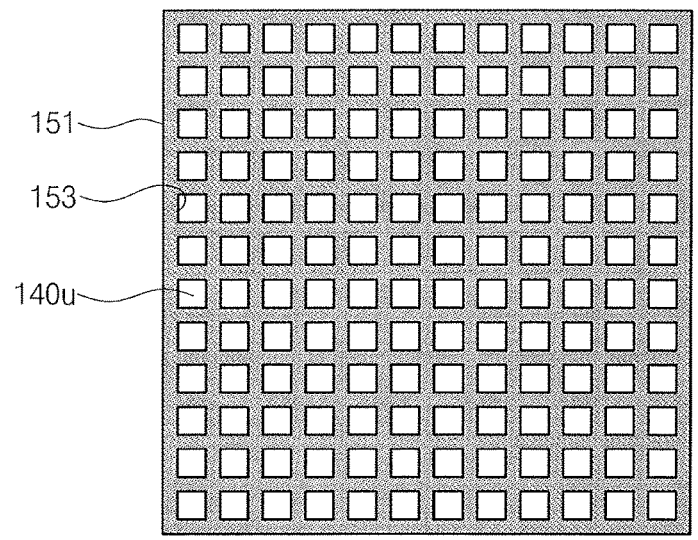
FIGS. 5A to 5B illustrate plan views of examples of a top layer according to some embodiments.
Figure 5B:
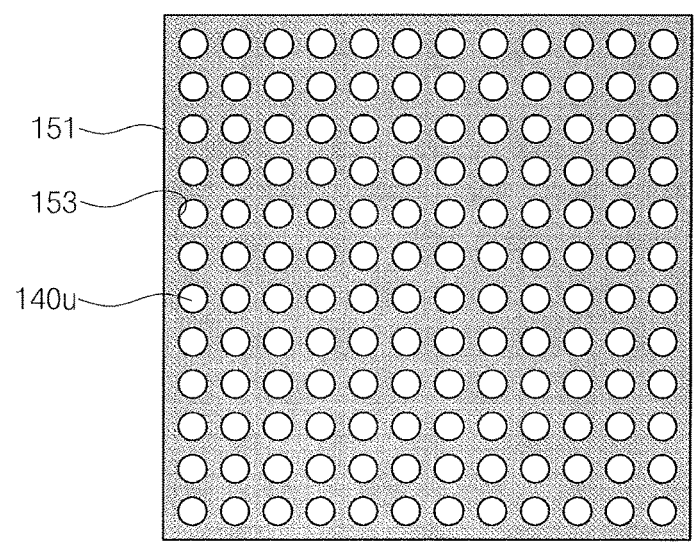

FIGS. 5A to 5B illustrate plan views of examples of the top layer 151 according to some embodiments. In an implementation, as shown in FIG. 4, the top layer 151 may not include openings therein. In an implementation, as shown in FIGS. 5A to 5B, the top layer 151 may include openings 153 penetrating therethrough. For example, the openings 153 may expose a top surface 140$u$ of the semiconductor light-emitting device 140, and the exposed top surface 140$u$ of the semiconductor light-emitting device 140 may be in contact with a molding layer 161 to be described below (e.g., through the openings). In an implementation, the openings 153 of the top layer 151 may be arranged in a regular manner along first and second directions orthogonal to each other, as shown in FIGS. 5A and 5B. In an implementation, a space between the openings 153 may be, e.g., about 1 µm to about 50 µm. In an implementation, a diameter of the openings 153 may be, e.g., about 5 µm to about 15 µm. The openings 153 may be filled with a molding layer 161 to be described below.

Referring back to FIGS. 1 to 3, a molding layer 161 may be provided on the top layer 151 to fill the mounting region RS. The molding layer 161 may include a short-wavelength phosphor. The short-wavelength phosphor may have a peak emission wavelength that is shorter than that of the red phosphor of the top layer 151. In an implementation, the short-wavelength phosphor may have a peak wavelength of, e.g., 510 nm to 560 nm. In an implementation, the short-wavelength phosphor may be a green phosphor.

In an implementation, the green phosphor may include, e.g., a LuAG phosphor having the following formula ((Lu, Y, Ga, La, Pr, Gd, or Tb)$_{3-x}$Al$_{5-y}$O$_{12-z}$:Ce$^{3+}{}_W$) (in which 0<x≤2, 0<y≤1.5, 0<z≤3, and 0.0001≤W<1), a YAG phosphor having the following formula ((Y, Lu, Ga, La, Pr, Gd, or Tb)$_{3-x}$Al$_y$O$_z$) (in which 0<x≤3, 0≤y≤6, and 0<z≤12), a garnet structure phosphor, a silicate phosphor having the following formula (e.g., (Sr, Mg, Ba, Ca)$_x$Si$_y$O$_z$:Eu$^{2+}$ (in which 0<x≤3, 0≤y≤7, and 1≤z≤12)), a phosphor having the following formula (Ca, Mg, or Sr)$_x$Al$_y$O$_z$:Eu$^{2+}$ (in which 0<x≤5, 2≤y≤12.5, and 0<z≤19), or a La$_3$Si$_6$N$_{11}$:Ce$^{3+}$ phosphor. In an implementation, the green phosphor may include a phosphor having the following formula (Ba, Ca, Mg, Sr, La, Lu, or Ga)$_x$(Al, Si, or Ge)$_y$O$_z$: Eu$^{2+}{}_a$, Mn$^{2+}{}_b$ (in which 0<x≤2, 0<y≤12.5, 0<z≤19.5, 0≤a≤0.5, and 0≤b≤1.0).

The molding layer 161 may have a refractive index that is substantially equal to or higher than that of the top layer 151. In an implementation, the refractive index of the molding layer 161 may be, e.g., about 0.1% to 5% higher than that of the top layer 151. In an implementation, the molding layer 161 may include, e.g., a phenyl silicone, and the top layer 151 may include, e.g., a methyl silicone. In an implementation, the molding layer 161 and the top layer 151 may have substantially the same refractive index.

The molding layer 161 may be formed in the mounting region RS by a process of mixing at least one of the green phosphors with a silicone and dispensing the mixture in the mounting region RS. The molding layer 161 may be in contact with the side surface of the semiconductor light-emitting device 140. In an implementation, the molding layer 161 may cover the side and top surfaces of the top layer 151. Due to the above structure of the molding layer 161, it is possible to prevent light that is emitted from the green phosphor of the molding layer 161 from being incident into the top layer 151 and from exciting the red phosphor. For example, the red phosphor may be spatially separated from the green phosphor, the top layer 151 with the red phosphor may be locally or selectively provided on the top surface of the semiconductor light-emitting device 140, and it is possible to prevent light that is emitted from the green phosphor from exciting the red phosphor and thereby to realize an improved light flux property and a uniform color quality.

For example, according to some embodiments, it is possible to improve a color consistency property of the light-emitting device package (e.g., to reduce a change of color caused by a change in angle).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

In the following Table 1, Comparative Example 1 shows values obtained from a light-emitting device package that was fabricated by sequentially dispensing a red-phosphor-containing silicone resin and a green-phosphor-containing silicone resin on a semiconductor light-emitting device. Comparative Example 2 shows values obtained from a light-emitting device package that was fabricated by sequentially dispensing a green-phosphor-containing silicone resin and a red-phosphor-containing silicone resin on a semiconductor light-emitting device. In the Example, the values were obtained from a light-emitting device package, which was fabricated by attaching a red-phosphor-containing top layer to a portion of a top surface of a semiconductor light-emitting device and forming a green-phosphor-containing molding layer thereon, as described above. Each of the values in Table 1 is a mean value of measurement values obtained from a plurality of light-emitting device packages.

TABLE 1

|  | COA (Color over Angle) | CCT (Correlated Color Temperature) | IV (Brightness) |
| --- | --- | --- | --- |
| Comparative Example 1 | 0.00976 | 5000 K | 100.5% |
| Comparative Example 2 | 0.00569 | 5000 K | 100% |
| Example | 0.00450 | 5000 K | 101.9% |

As shown in Table 1, for the light-emitting device package according to the Example, the CCT and IV properties were maintained to a level similar to those of the Comparative Examples, but the COA property was improved, compared with the Comparative Examples. For example, even when there was a change in angle with respect to an imaginary axis normal to a top surface of the light-emitting device package, it was possible to reduce a change in color of light emitted from the light-emitting device package according to the Example.

Figure 6:
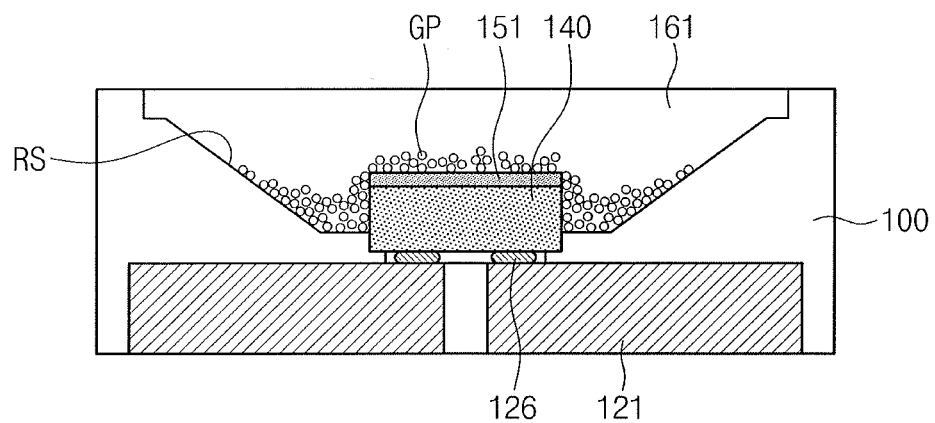
FIGS. 6 and 7 illustrate sectional views of examples of an arrangement of green phosphors in a molding layer, according to some embodiments.
Figure 7:
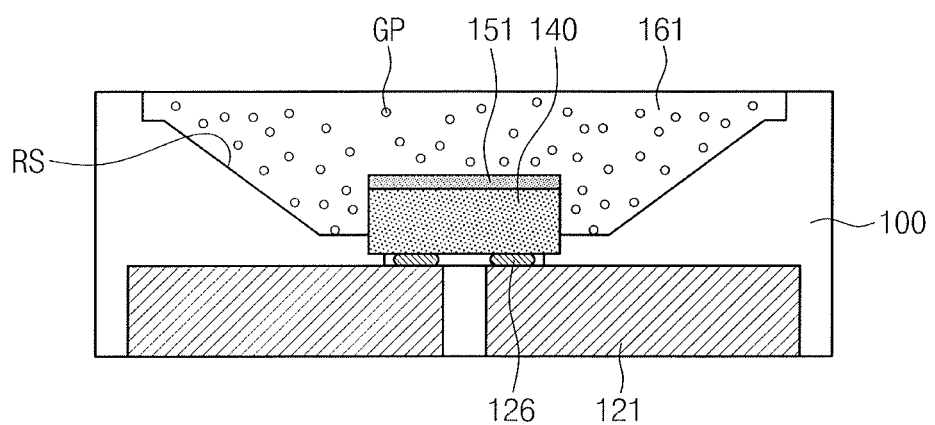

FIGS. 6 and 7 illustrate sectional views of examples of an arrangement of green phosphors GP provided in the molding layer 161, according to some embodiments. In an implementation, as shown in FIG. 6, the green phosphors GP may be provided in a lower portion of the molding layer 161 or in a deposited form. For example, the concentration of the green phosphor GP may be higher at a lower portion of the molding layer 161 (e.g., proximate to the lead frame 121) than at an upper portion of the molding layer 161 (e.g., distal to the lead frame 121). In an implementation, as shown in FIG. 7, the green phosphor GP may be distributed in the molding layer 161 in a substantially uniform manner.

Figure 8:
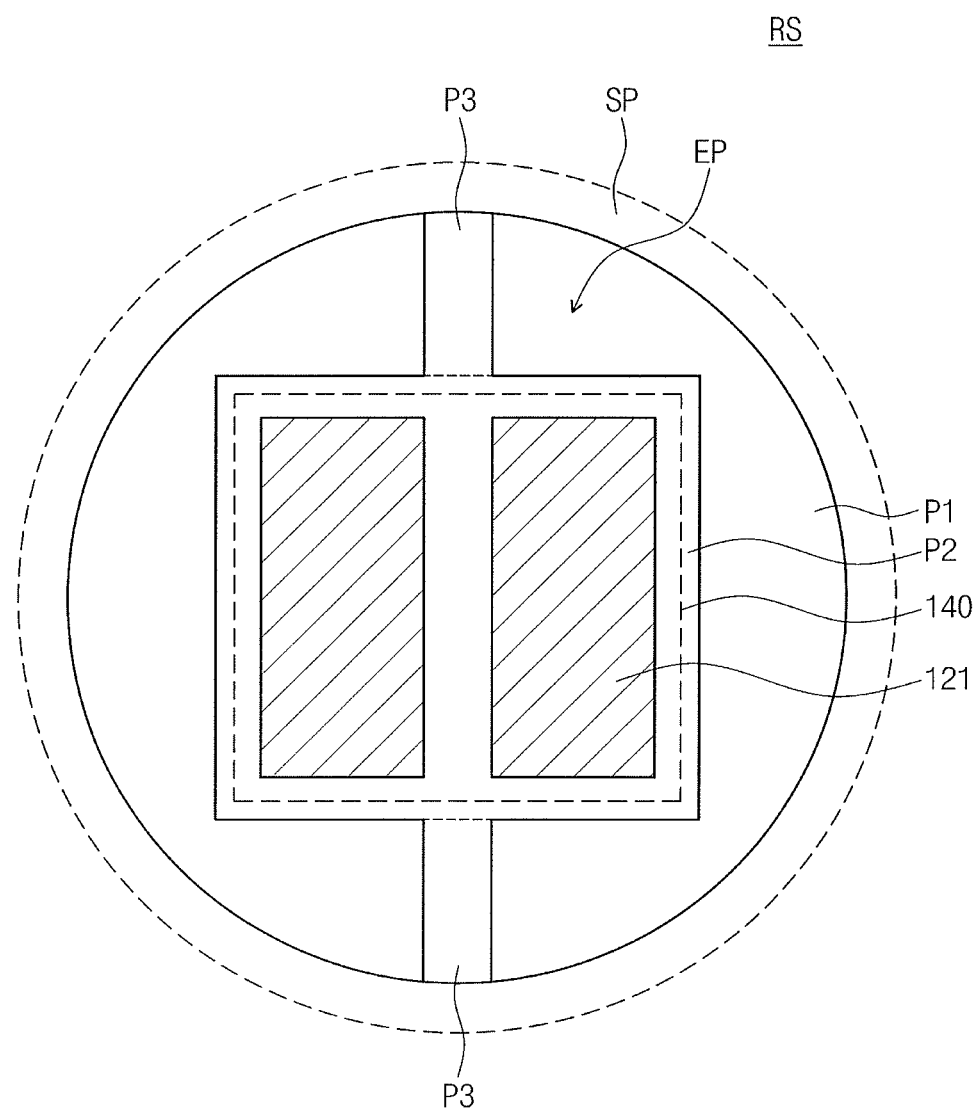
FIG. 8 illustrates an enlarged view of a mounting region of a semiconductor light-emitting device package, according to some embodiments.

FIG. 8 illustrates an enlarged view of the mounting region RS of a semiconductor light-emitting device package, according to some embodiments. In the present embodiment, the extension region EP may include a first portion P1, which is connected to the reflection region SP, a second portion P2, which extends from the first portion P1 and has a portion interposed between the semiconductor light-emitting device 140 and the lead frame 121, and a third portion P3, which extends from the second portion P2 to the reflection region SP. The first portion P1 may be thicker than the second portion P2 and the third portion P3. The third portion P3 may be provided in the form of a trench and may connect the second portion P2 to the reflection region SP. For example, the second portion P2 and the third portion P3 may have substantially the same thickness. In an implementation, a plurality of the third portions P3 may be provided. As an example, a pair of the third portions P3 may be spaced apart from each other with the semiconductor light-emitting device 140 interposed therebetween. In an implementation, the third portion P3 may be omitted in the semiconductor light-emitting device package, as shown in FIG. 1.

Figure 9:
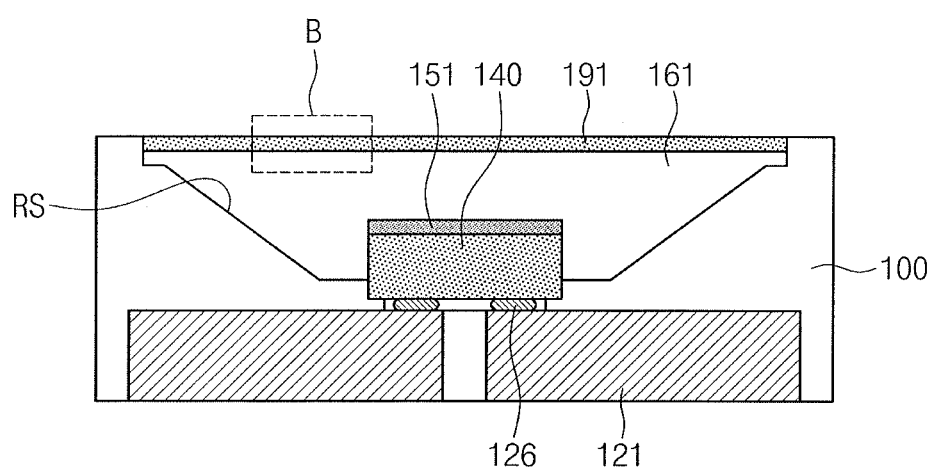
FIG. 9 illustrates a sectional view of a semiconductor light-emitting device package according to some embodiments.

FIG. 9 illustrates a sectional view of a semiconductor light-emitting device package according to some embodiments. FIGS. 10 to 13 illustrate enlarged views of a portion B of FIG. 9. For concise description, a previously described element may be identified by a similar or identical reference number without repeating an overlapping description thereof.

Referring to FIGS. 9 to 13, a semiconductor light-emitting device package may include an anti-reflection layer 191 on the molding layer 161. The anti-reflection layer 191 may have a refractive index that is lower than that of the molding layer 161. In this case, it is possible to reduce reflection of light generated in the semiconductor light-emitting device 140 by the top surface of the molding layer 161 and thereby to increase light extraction efficiency of the semiconductor light-emitting device package. The anti-reflection layer 191 may be provided in an upper region of the mounting region RS.

Figure 10:
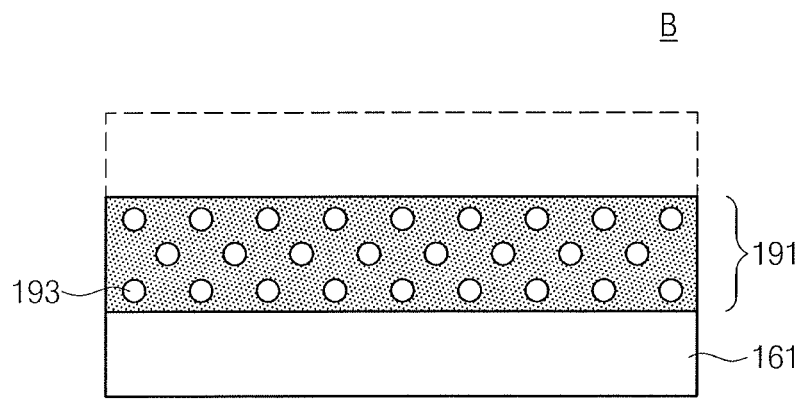
FIGS. 10 to 13 illustrate enlarged views of a portion B of FIG. 9.

In an implementation, referring to FIG. 10, the anti-reflection layer 191 may be an inorganic layer structure in which voids 193 are provided. The voids 193 may be an empty space, in which a solid material is not provided, or may be in a vacuum state or be a structure filled with the air or gas. The inorganic layer may include, e.g., SiO$_x$, MgF$_x$, $SiC_x$, $TiO_x$, $HfO_x$, $Ta_xO_y$, or SiN, in which x and y are integers. In an implementation, the formation of the voids 193 may include providing volatile sacrificial particles in the inorganic layer during the deposition of the inorganic layer and removing the sacrificial particles using, e.g., a volatilization method.

Figure 11:
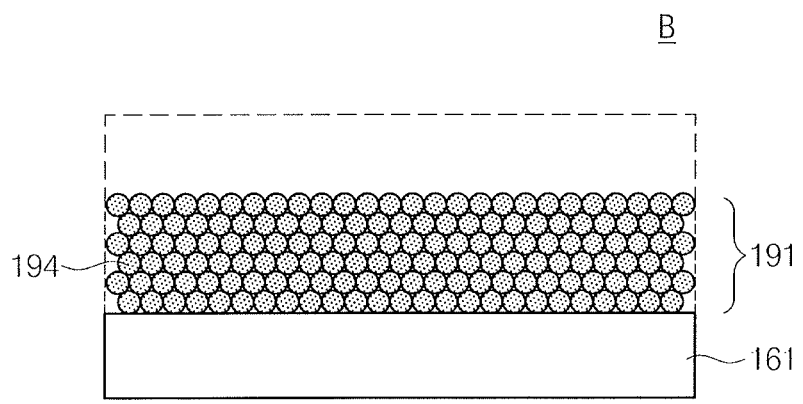

In an implementation, referring to FIG. 11, the anti-reflection layer 191 may be a structure that is formed by sintering inorganic colloid particles 194 having a size of, e.g., about 1 nm to about 1 μm. In an implementation, the inorganic colloid particles 194 may include, e.g., $SiO_x$, $MgF_x$, $SiC_x$, $TiO_x$, $HfO_x$, $Ta_xO_y$, or SiN, in which x and y are integers. In an implementation, the formation of the anti-reflection layer 191 may include depositing a volatile solvent, in which the inorganic colloid particles 194 are included, and performing a thermal treatment thereon.

Figure 12:
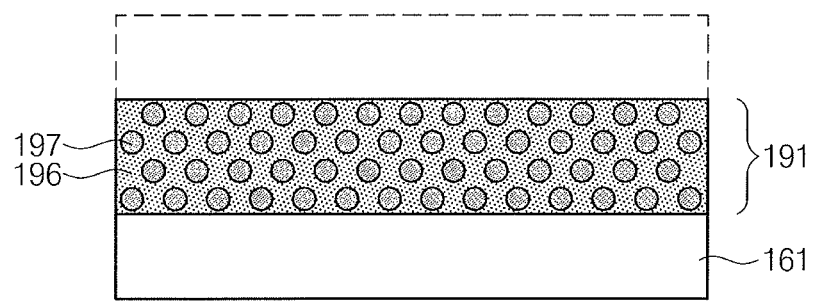

In an implementation, referring to FIG. 12, the anti-reflection layer 191 may include an organic layer 196 and inorganic colloid particles 197 scattered in the organic layer 196. In an implementation, the inorganic colloid particles 197 may include, e.g., $SiO_x$, $MgF_x$, $SiC_x$, $TiO_x$, $HfO_x$, $Ta_xO_y$, or SiN, in which x and y are integers. The organic layer 196 may include, e.g., a phenyl silicone or a methyl silicone. In an implementation, the inorganic colloid particles 197 may be uniformly scattered in the organic layer 196, as shown in FIG. 12, or the inorganic colloid particles 197 may be provided in such a way that a concentration thereof is higher at a lower portion of the organic layer 196 than elsewhere.

Figure 13:
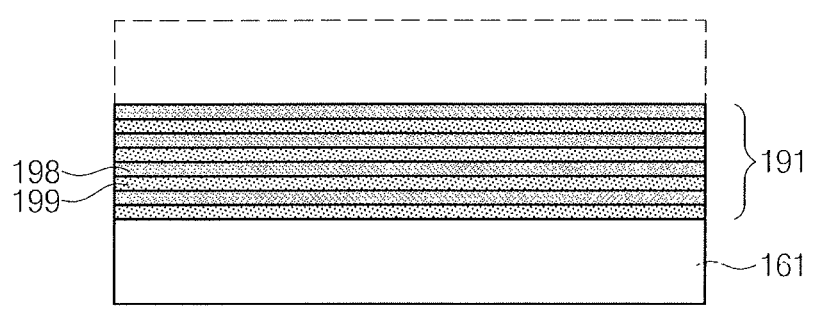

In an implementation, referring to FIG. 13, the anti-reflection layer 191 may be a structure in which first inorganic layers 199 and second inorganic layers 198 are alternately and repeatedly stacked one on another. In an implementation, the first inorganic layers 199 may include, e.g., $SiO_x$, $MgF_x$, $SiC_x$, $TiO_x$, $HfO_x$, $Ta_xO_y$, or SiN, in which x and y are integers. In an implementation, the second inorganic layers 198 may include, e.g., $SiO_x$, $MgF_x$, $SiC_x$, $TiO_x$, $HfO_x$, $Ta_xO_y$, or SiN, in which x and y are integers.

In an implementation, unlike those illustrated in FIGS. 10 to 13, the anti-reflection layer 191 may include a single inorganic or organic layer, in which a void or particle is not included.

By way of summation and review, a gallium nitride (GaN) light-emitting diode may be utilized for commercialization of a keypad of a cellular phone, a turn signal lamp, a camera flash, and so forth, and for development of an illumination system using a light-emitting diode. The demand for products using the light-emitting diode has been changed from compact portable products to large-sized, high-powered, and highly-efficient products (e.g., a backlight unit of a large-sized TV, a vehicle headlight, a general illumination, and so forth), and thus, a light source suitable for the large-sized, high-powered, and highly-efficient products may be desirable.

As the semiconductor light-emitting device is used for various applications, a method may be capable of improving optical efficiency and reliability of the semiconductor light-emitting device package.

According to some embodiments, it is possible to provide a light-emitting device package configured to have an improved light flux property and a uniform color quality.

The embodiments may provide a light-emitting device package with increased light extraction efficiency and improved color constancy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting device (LED) package, comprising:
    a package body including a mounting region at an upper portion thereof;
    a lead frame below the package body;
    a semiconductor light-emitting device in the mounting region and electrically connected to the lead frame;
    a top layer attached to a top surface of the semiconductor light-emitting device, the top layer including a red phosphor; and
    a molding layer in the mounting region, the molding layer covering the top layer and including a short-wavelength phosphor having a peak emission wavelength that is shorter than a peak emission wavelength of the red phosphor,
    wherein:
    the top layer exposes a side surface of the semiconductor light-emitting device,
    the molding layer is in contact with the side surface of the semiconductor light-emitting device,
    the mounting region includes:
        a reflection region extending from a top surface of the package body to a center portion of the package body; and
        an extension region extending from the reflection region to the side surface of the semiconductor light-emitting device,
    the extension region has a stepwise structure, the stepwise structure including:
        a first portion connected to the reflection region; and
        a second portion extended from the first portion and interposed between the semiconductor light-emitting device and the lead frame,
    the second portion has a thickness smaller than that of the first portion,
    the second portion has a top surface that is in contact with a bottom surface of the semiconductor light-emitting device, and
    the first portion has a side surface that is in contact with the side surface of the semiconductor light-emitting device.

2. The LED package as claimed in claim 1, wherein a lowermost surface of the top layer is located at a level that is equal to or higher than an uppermost surface of the semiconductor light-emitting device.

3. The LED package as claimed in claim 1, further comprising an adhesive layer between the top layer and the semiconductor light-emitting device, wherein the adhesive layer includes a silicone or an epoxy.

4. The LED package as claimed in claim 1, wherein a border between the first portion and the second portion has a shape complementary to the side surface of the semiconductor light-emitting device.

5. The LED package as claimed in claim 1, wherein:
    the stepwise structure further includes a third portion extending from the second portion to the reflection region, and the third portion has a thickness that is smaller than that of the first portion.

6. The LED package as claimed in claim 1, wherein the reflection region is inclined at an angle of 20° to 40°, relative to the top surface of the package body.

7. The LED package as claimed in claim 1, wherein the top layer is provided in a form of a silicone polymer film or a ceramic plate.

8. The LED package as claimed in claim 1, wherein a thickness of the top layer is 30 μm to 400 μm.

9. The LED package as claimed in claim 1, wherein the top layer has a shape corresponding to the top surface of the semiconductor light-emitting device.

10. The LED package as claimed in claim 1, wherein the top layer includes openings penetrating therethrough.

11. The LED package as claimed in claim 1, wherein the short-wavelength phosphor includes a LuAG phosphor having the following formula: $(Lu, Y, Ga, La, Pr, Gd, or Tb)_{3-x}Al_{5-y}O_{12-z}:Ce^{3+}_w$, in which $0<x\leq2$, $0<y\leq1.5$, $0<z\leq3$, and $0.0001\leq w<1$, a YAG phosphor having the following formula: $(Y, Lu, Ga, La, Pr, Gd, or Tb)_{3-x}Al_yO_z$, in which $0<x\leq3$, $0\leq y\leq6$, and $0<z\leq12$, a garnet structure phosphor, a silicate phosphor having the following formula: $(Sr, Mg, Ba, or Ca)_xSi_yO_z:Eu^{2+}$, in which $0<x\leq3$, $0\leq y\leq7$, and $1\leq z\leq12$, a phosphor having the following formula: $(Ca, Mg, or Sr)_xAl_yO_7:Eu^{2+}$, in which $0<x\leq5$, $2\leq y\leq12.5$ and $0<z\leq19$, a phosphor having the following formula: $La_3Si_6N_{11}:Ce^{3+}$, or a phosphor having the following formula: $(Ba, Ca, Mg, Sr, La, Lu, or Ga)_x(Al, Si, or Ge)_yO_z: Eu^{2+}_a, Mn^{2+}_b$, in which $0<x\leq2$, $0<y\leq12.5$, $0<z\leq19.5$, $0\leq a\leq0.5$, and $0\leq b\leq1.0$.

12. A light-emitting device (LED) package, comprising:
a package body including a mounting region at an upper portion thereof;
a lead frame below the package body;
a semiconductor light-emitting device in the mounting region and electrically connected to the lead frame;
a top layer attached to a top surface of the semiconductor light-emitting device, the top layer including a red phosphor; and
a molding layer in the mounting region, the molding layer covering the top layer and including a short-wavelength phosphor having a peak wavelength that is shorter than a peak wavelength of the red phosphor,
wherein the mounting region includes a reflection region that extends from a top surface of the package body to a center portion of the package body, and an extension region that extends from the reflection region to a side surface of the semiconductor light-emitting device,
wherein the top layer is spaced apart from the extension region,
wherein the extension region has a stepwise structure, the stepwise structure including:
a first portion connected to the reflection region; and
a second portion extended from the first portion and interposed between the semiconductor light-emitting device and the lead frame,
wherein the second portion has a thickness that is smaller than that of the first portion,
wherein the second portion has a top surface that is in contact with a bottom surface of the semiconductor light-emitting device, and
wherein the first portion has a side surface that is in contact with the side surface of the semiconductor light-emitting device.

13. The LED package as claimed in claim 12, wherein a border between the first and second portions has a shape complementary to the side surface of the semiconductor light-emitting device.

14. The LED package as claimed in claim 13, wherein the reflection region is inclined at an angle of 20° to 40°, relative to the top surface of the package body.

15. The LED package as claimed in claim 14, wherein the top layer includes openings penetrating therethrough.

16. A light-emitting device (LED) package, comprising:
a package body including a mounting region at one side thereof;
a lead frame on a side of the package body that is opposite to the mounting region;
a semiconductor light-emitting device in the mounting region and electrically connected to the lead frame;
a top layer on a top surface of the semiconductor light-emitting device, the top layer including a red phosphor; and
a molding layer in the mounting region and covering the top layer, the molding layer including a short-wavelength phosphor that has a peak wavelength that is shorter than that of the red phosphor,
wherein the molding layer is in contact with a side surface of the semiconductor light-emitting device,
wherein the mounting region includes a reflection region that extends from a top surface of the package body to a center portion of the package body, and an extension region that extends from the reflection region to the side surface of the semiconductor light-emitting device,
wherein the extension region has a stepwise structure, the stepwise structure including:
a first portion connected to the reflection region; and
a second portion extended from the first portion and interposed between the semiconductor light-emitting device and the lead frame,
wherein the second portion has a thickness that is smaller than that of the first portion,
wherein the second portion has a top surface that is in contact with a bottom surface of the semiconductor light-emitting device, and
wherein the first portion has a side surface that is in contact with the side surface of the semiconductor light-emitting device.

* * * * *